(12) United States Patent
Alestig

(10) Patent No.: US 6,881,655 B2
(45) Date of Patent: Apr. 19, 2005

(54) CONTACT RESISTANCES IN INTEGRATED CIRCUITS

(75) Inventor: Goran Alestig, Gothenburg (SE)

(73) Assignee: Zarlink Semiconductor Limited, Wiltshire (GB)

( * ) Notice: Subject to any disclaimer, the term of this patent is extended or adjusted under 35 U.S.C. 154(b) by 0 days.

(21) Appl. No.: 10/241,320

(22) Filed: Sep. 11, 2002

(65) Prior Publication Data

US 2003/0071282 A1 Apr. 17, 2003

(30) Foreign Application Priority Data

Sep. 14, 2001 (GB) .............................................. 0122221

(51) Int. Cl.[7] .......................... H01L 21/28; H01L 21/44
(52) U.S. Cl. ...................................... 438/571; 438/384
(58) Field of Search ................................ 438/152, 153, 438/154, 384, 424, 524, 571

(56) References Cited

U.S. PATENT DOCUMENTS

| | | | |
|---|---|---|---|
| 4,210,465 A | 7/1980 | Brower ........................ 148/1.5 |
| 4,690,728 A | 9/1987 | Tsang et al. ................. 156/643 |
| 4,829,024 A | 5/1989 | Klein et al. .................. 437/189 |
| 5,310,457 A | 5/1994 | Ziger ........................... 156/657 |
| 5,612,956 A | 3/1997 | Walker et al. ............... 370/545 |
| 5,790,552 A | 8/1998 | Proctor et al. ............... 370/466 |
| 5,970,360 A | 10/1999 | Cheng et al. | |
| 5,972,124 A | 10/1999 | Sethuraman et al. | |
| 6,087,273 A | 7/2000 | Torek et al. | |
| 6,171,405 B1 | 1/2001 | Lee ................................ 134/3 |
| 6,225,183 B1 * | 5/2001 | Lee | |
| 6,509,271 B1 * | 1/2003 | Kobayashi | |

FOREIGN PATENT DOCUMENTS

| | | | | |
|---|---|---|---|---|
| EP | 0468818 A2 | 7/1991 | ........... H04L/12/56 |
| EP | 0 469 214 | 2/1992 | |
| EP | 0618709 A2 | 2/1994 | ........... H04L/29/06 |
| EP | 0705000 A2 | 9/1995 | ............. H04L/3/06 |
| EP | 0618709 A3 | 3/1998 | ........... H04L/29/06 |
| EP | 0705000 A3 | 5/1998 | ............. H04L/3/06 |
| EP | 1122916 A2 | 1/2001 | ........... H04L/12/56 |
| GB | 2270820 A | 3/1994 | ........... H04L/12/56 |
| GB | 0121217.4 | 9/2001 | |
| GB | 0122221.5 | 9/2001 | |
| GB | 0125612.2 | 10/2001 | |
| GB | 0126246.8 | 11/2001 | |
| JP | 02-280439 A | 11/1990 | ........... H04L/12/56 |
| JP | 09 055746 A | 2/1997 | ........... H04L/12/28 |
| JP | 10189782 | 7/1998 | |
| WO | WO 90/07832 A1 | 7/1990 | ............. H04L/3/16 |

OTHER PUBLICATIONS

U.S. Appl. Ser. No., 10/231,918, Martin et al., filed Aug. 30, 2002.
U.S. Appl. Ser. No., 10/246,154, Scott et al., filed Sep. 18, 2002.
U.S. Appl. Ser. No., 10/262,240, Scott et al., filed Oct. 1, 2002.
S.M. Sze, VLSI Technology, McGraw–Hill Book Company, New York (1983), pp. 267–268, 303–304.
EP Search Report, Application No. EP 02 10 2073, dated Jul. 10, 2003.

* cited by examiner

*Primary Examiner*—Phuc T. Dang
(74) *Attorney, Agent, or Firm*—Moser, Patterson & Sheridan, L.L.P.

(57) ABSTRACT

A method is provided of forming a low resistance contact between a poly-silicon resistor of an integrated circuit and a conducting material, the method comprising the steps of:

a) covering the resistor with an insulating layer;

b) etching at least one contact opening in the insulating layer;

c) cleaning the insulating layer to remove any residues from the etching process;

d) applying phosphoric acid; and e) depositing a conducting layer which forms an electrical contact with said resistor.

38 Claims, No Drawings

CONTACT RESISTANCES IN INTEGRATED CIRCUITS

The invention relates to improvements in contact resistances in integrated circuits.

In the manufacture of integrated circuits, many different components are needed to make a functional device. Among these component are resistors which can be made using silicon deposited on the silicon wafer. The silicon is usually deposited with an amorphous or poly-crystalline structure, referred to herein as "poly-silicon".

The resistors are usually doped with boron, phosphorus or arsenic to set the resistivity of the poly-silicon to a suitable value. In later stages of the processing, the resistors are covered with an insulating layer. Openings are made in the insulating layer to form contacts to the poly-silicon resistors.

The resistors are then connected to other parts of the integrated circuit using a conducting material, usually a metal such as aluminium. Very often the aluminium has small concentrations of silicon or copper added.

To ensure good functionallity for the integrated circuit, it is important that the contact resistance between the poly-silicon resistor and the conducting material is low and well controlled. It is known that if the conducting material used is aluminium and the poly-silicon is doped with phosphorus or arsenic (n-type doping), the contact resistance can be high and variable.

A known method of etching the contact openings to the poly-silicon resistors is described in S. M. Sze, VLSI Technology, McGraw-Hill Book Company, New York, 1983. A masking step is used to define areas for the contact openings to the poly-silicon resistors. The insulating layer is then etched using a plasma etch method or a wet etch method. Combinations of the two methods are also known. The etching is followed by stripping and cleaning steps to remove the masking layer and any residues from the etching process.

The final cleaning step is very important to achieve a good contact. This cleaning is usually made using hydrofluoric acid (HF) diluted in water. The diluted HF will remove any residues of silicon oxide but is not effective in removing any damaged unoxidised silicon.

Other known cleaning steps used at this point use a $H_2O$—$H_2O_2$—$NH_4OH$ mixture and a $H_2O$—$H_2O_2$—$HCl$ mixture. The use of a $H_2O$—$H_2SO_4$—$H_2O_2$ mixture to clean contact areas is also well known. After the cleaning, the conducting layer is deposited using an evaporation or sputter deposition method.

The use of phosphoric acid in the manufacture of integrated circuits is known but it is normally used for removal of silicon nitride layers, as described in D. H. Ziger, U.S. patent application U.S. 1992000954982, Sep. 30, 1992.

According to the invention there is provided a method of forming a low resistance contact between a poly-silicon resistor of an integrated circuit and a conducting material, as set out in the accompanying claims.

An embodiment of the invention will now be described, by way of example only.

The embodiment provides a method to decrease the contact resistance to the type of components described above. The embodiment also reduces the spread (ie. variation) in contact resistance.

A key feature of the embodiment is the use of phosphoric acid at a processing step where it has not been used before. Phosphoric acid is also sometimes known as ortho-phosphoric acid, and has the chemical formula $H_3PO_4$. A short dip in hot phosphoric acid is inserted in the normal processing sequence. The dip is done after the contact openings to the silicon or polysilicon are etched but before the conducting layer is deposited.

The phosphoric acid is often already available since it is normally used at other processing steps. This makes it easy to implement the embodiment in an existing manufacturing process. In summary, key advantages of the embodiment are:

1. Reduced contact resistance to poly-silicon components;
2. Reduced spread in contact resistance to poly-silicon;
3. Few and non-expensive steps added to process flow; and
4. Uses equipment and chemicals normally already available.

Contact openings are etched in an insulating layer using standard etching methods incorporating a masking resist layer as described above. After the etching of the contact openings, the masking resist layer is removed using standard methods. Cleaning after this resist strip is also carried out using standard methods known to the semiconductor processing industry. If the etch procedure normally has a dip in a water—hydrofluoric acid mixture, this dip should be kept so that any remaining silicon oxide is removed from the contact openings.

The new process step using phosphoric acid is now inserted. This step consists of a short dip in hot phosphoric acid. The temperature should be about 170 C. and the concentration approximately 85% phosphoric acid and 15% water. The dip time should be a few minutes, typically 5 to 10 minutes. The dip in phosphoric acid should be followed by a water rinse.

After the new process step using the phosphoric acid, standard processing is continued. Any normal cleaning steps before the conducting layer is deposited should be kept.

The etching and cleaning steps prior to the dip in phosphoric acid can be varied using different chemicals, concentrations or dip times.

The dip in phosphoric acid can use variations in the concentration, dip time and temperature.

The dip in phosphoric acid can be replaced by the use of a spray-type delivery system where phosphoric acid is sprayed towards the wafer surface.

What is claimed is:

1. A method of forming a low resistance contact between a poly-silicon resistor of an integrated circuit and a conducting material, the method comprising the steps of:
   a) covering the resistor with an insulating layer, the resistor being disposed on a wafer;
   b) etching at least one contact opening in the insulating layer to the resistor;
   c) cleaning the insulating layer to remove any residues from the etching process;
   d) dipping the wafer carrying said poly-silicon resistor into phosphoric acid after etching to the resistor; and
   e) depositing a conducting layer in the at least one contact opening to form an electrical contact with said resistor.

2. The method as claimed in claim 1, wherein the concentration of the phosphoric acid is approximately 85% phosphoric acid to 15% water.

3. The method as claimed in claim 1, wherein the temperature of the phosphoric acid during step (d) is approximately 170° C.

4. The method as claimed in claim 1, wherein the time for which the phosphoric acid is applied is less than 15 minutes.

5. The method as claimed in claim 4, wherein the time for which the phosphoric acid is applied is between 5 and 10 minutes.

6. The method as claimed in claim 5, further comprising the step of:
   rinsing the wafer with a water rinse after the phosphoric acid has been applied.

7. The method as claimed in claim 1, wherein said conducting layer is deposited using an evaporation method.

8. The method as claimed in claim 1, wherein said cleaning step is carried out using hydrofluoric acid.

9. The method as claimed in claim 1, wherein said etching step comprises a masking step to define areas for said contact openings.

10. The method as claimed in claim 9, wherein said masking step uses a masking resist layer.

11. The method as claimed in claim 10, wherein said masking resist layer is removed after cleaning of said contact openings.

12. The method as claimed in claim 1, wherein said etching step is carried out using a plasma etch method.

13. The method as claimed in claim 1, wherein said resistor is doped with a chemical selected from the group consisting of boron, phosphorus and arsenic.

14. The method as claimed in claim 1, wherein said conducting material is aluminum.

15. The method as claimed in claim 14, wherein said aluminum contains small concentrations of silicon.

16. The method as claimed in claim 1, wherein said conducting layer is deposited using a sputter deposition method.

17. The method as claimed in claim 1, wherein said etching step is carried out using a wet etch method.

18. The method as claimed in claim 17, wherein said etching step is carried out using a combination of a plasma etch method and a wet etch method.

19. The method as claimed in claim 14, wherein said aluminum contains small concentrations of copper.

20. A method of forming a low resistance contact between a poly-silicon resistor of an integrated circuit and a conducting material, the method comprising the steps of:
   a) covering the resistor with an insulating layer;
   b) etching at least one contact opening in the insulating layer to the resistor;
   c) cleaning the insulating layer to remove any residues from the etching process;
   d) applying phosphoric acid to the resistor; and
   e) depositing a conducting layer which forms an electrical contact with said resistor.

21. The method as claimed in claim 20, wherein step (d) is carried out by either dipping or spraying the wafer carrying said poly-silicon resistor into phosphoric acid after initiating etching.

22. The method as claimed in claim 20, wherein the concentration of the phosphoric acid is approximately 85% phosphoric acid to 15% water.

23. The method as claimed in claim 21, wherein the temperature of the phosphoric acid during step (d) is approximately 170° C.

24. The method as claimed in claim 1, wherein the time for which the phosphoric acid is applied is less than 15 minutes.

25. The method as claimed in claim 21, further comprising the step of rinsing the wafer with a water rinse after the phosphoric acid has been applied.

26. The method as claimed in claim 20, wherein said conducting layer is deposited using either an evaporation method or a sputter deposition method.

27. The method as claimed in claim 20, wherein said cleaning step is carried out using hydrofluoric acid.

28. The method as claimed in claim 20, wherein:
   said etching step comprises a masking step using a masking resist layer to define areas for said contact openings; and
   said masking resist layer is removed after cleaning of said contact openings.

29. The method as claimed in claim 20, wherein said etching step is carried out using either a plasma etch method or a wet etch method.

30. The method as claimed in claim 20, wherein said etching step is carried out using a combination of plasma etch method and a wet etch method.

31. The method as claimed in claim 20, wherein said resistor is doped with a chemical selected from the group consisting of boron, phosphorus and arsenic.

32. The method as claimed in claim 20, wherein said conducting material is aluminum.

33. The method as claimed in claim 32, wherein said aluminum contains small concentrations of silicon.

34. The method as claimed in claim 32, wherein said aluminum contains small concentrations of copper.

35. The method as claimed in claim 1, wherein:
   said poly-silicon resistor is disposed on a wafer; and
   step (d) comprises applying phosphoric acid onto the wafer.

36. A method of forming a low resistance contact between a poly-silicon resistor of an integrated circuit and a conducting material, the method comprising the steps of:
   a) covering the resistor with an insulating layer;
   b) etching at least one contact opening in the insulating layer to the resistor, said etching step comprising a masking step to define areas for said contact openings;
   c) cleaning the insulating layer to remove any residues from the etching process;
   d) applying phosphoric acid to the at least one contact opening after initiating etching; and
   e) depositing a conducting layer which forms in the at least one contact opening to form an electrical contact with said resistor.

37. The method as claimed in claim 36, wherein said masking step uses a masking resist layer.

38. The method as claimed in claim 37, wherein said masking resist layer is removed after cleaning of said contact openings.

* * * * *